United States Patent [19]

Fang et al.

[11] Patent Number: 4,649,638

[45] Date of Patent: Mar. 17, 1987

[54] CONSTRUCTION OF SHORT-LENGTH ELECTRODE IN SEMICONDUCTOR DEVICE

[75] Inventors: Frank F. Fang, Yorktown Heights; Bertrand M. Grossman, New York, both of N.Y.

[73] Assignee: International Business Machines Corp., Armonk, N.Y.

[21] Appl. No.: 724,147

[22] Filed: Apr. 17, 1985

[51] Int. Cl.$^4$ ............................................. H01L 21/28
[52] U.S. Cl. .......................... 29/590; 29/576 W; 29/571; 29/578; 29/580; 148/DIG. 122; 357/23.1
[58] Field of Search ............... 29/571, 576 W, 580, 29/578, 590; 756/643, 662, 657; 148/DIG. 25, DIG. 51, DIG. 122, DIG. 131; 357/23.1, 23.3

[56] References Cited

U.S. PATENT DOCUMENTS

| | | |
|---|---|---|
| 4,037,307 | 7/1977 | Smith . |
| 4,209,350 | 6/1980 | Ho et al. ............................ 148/188 |
| 4,234,362 | 11/1980 | Riseman ............................ 148/187 |
| 4,256,514 | 3/1981 | Pogge ................................ 148/1.5 |
| 4,312,680 | 10/1982 | Hsu .................................... 148/1.5 |
| 4,313,782 | 2/1982 | Sokoloski . |
| 4,334,348 | 6/1982 | Trenary et al. .................... 29/571 |
| 4,358,340 | 11/1982 | Fu . |
| 4,430,791 | 2/1984 | Dockerty ........................... 29/571 |
| 4,503,601 | 3/1985 | Chiao ................................ 29/571 |
| 4,532,698 | 8/1985 | Fang et al. ........................ 29/571 |
| 4,539,744 | 9/1985 | Burton .............................. 29/580 |
| 4,542,577 | 9/1985 | Jackson ............................. 29/571 |
| 4,546,535 | 10/1985 | Shepard ............................ 29/271 |

OTHER PUBLICATIONS

International Business Machines-Technical Disclosure Bulletin "Half-Micron Trench Isolation by Aluminum Masking and Self-Aligning Sidewall Processes" by A. J. Dally; Mar. 1985; vol. 27, No. 10A; pp. 5607-5612.

Primary Examiner—Brian E. Hearn
Assistant Examiner—Tuan Quach
Attorney, Agent, or Firm—Perman & Green

[57] ABSTRACT

A construction process employs an insulating abutment which serves as a guide in the formation of a short-length electrode in the fabrication of a semiconductor device. The process is particularly useful in construction of extremely short channel asymmetric lightly doped drain (LDD) silicon FET's in which case a bird beak is formed on the surface of a silicon wafer. The bird beak is composed of silicon dioxide produced by oxidation of the silicon substrate with the aid of an oxidation resistant covering of silicon nitride, the edge of which defines the location of the abutment. Reactive ion etching is employed to remove excess silicon dioxide leaving a vertical wall at one side of the abutment. Thereafter, the silicon nitride layer is stripped off leaving a slating roof to the abutment. A dope polysilicon layer is deposited conformally on the surface of the substrate and on the abutment to a depth equal to the desired length of the electrode. Further reactive ion etching removes all of the polysilicon except for the portion thereof appended to the vertical wall of the abutment. Thereafter, ion implantation establishes a drain region at the side of the abutment having the slanting roof and a source region at the side of the abutment facing the vertical wall. The profile of the ion implantation follows the profile of the abutment enabling the stopping properties of the abutment to constrict the amount of charge implanted in the drain side of the channel.

11 Claims, 9 Drawing Figures

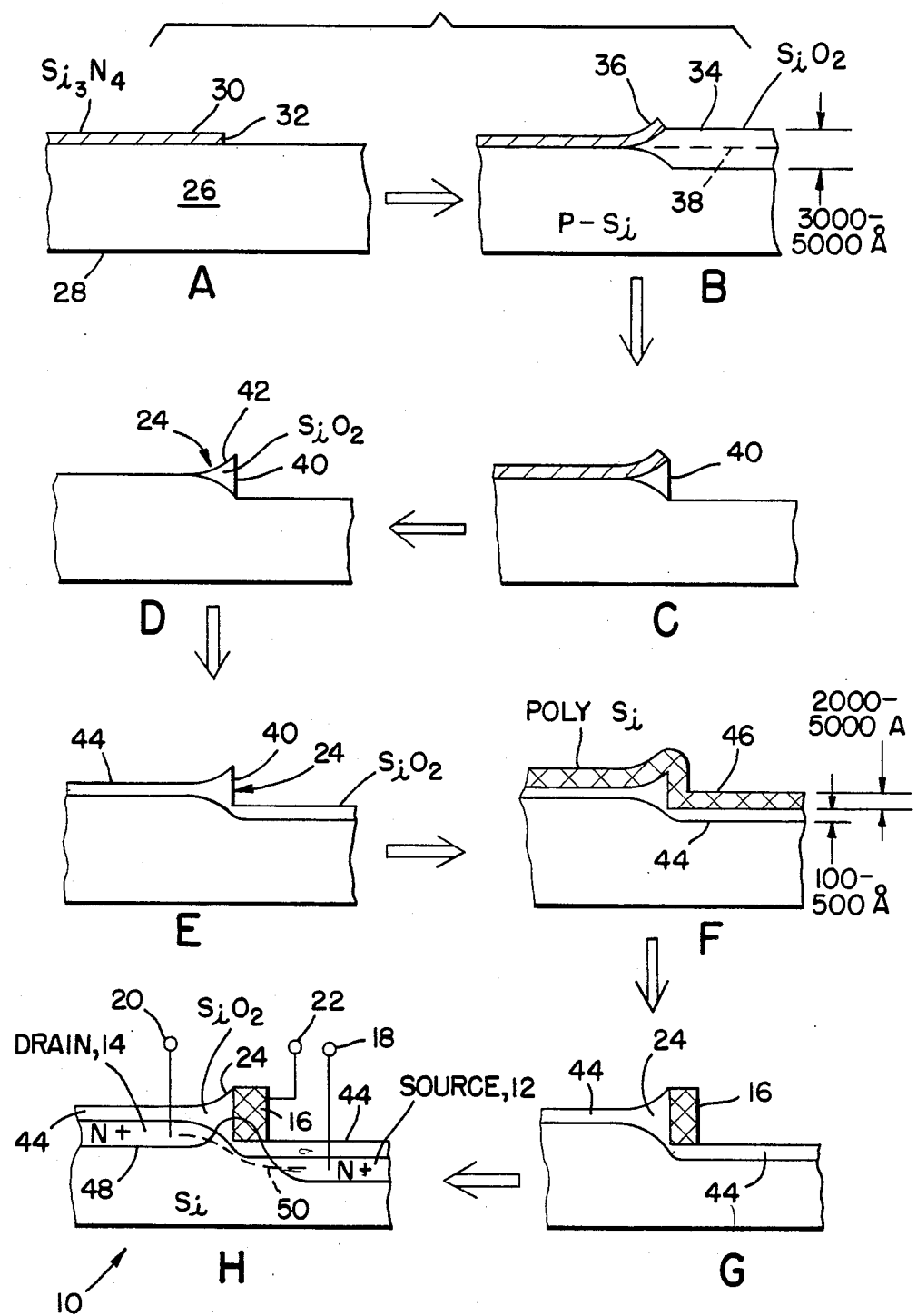

CONSTRUCTION OF SHORT-LENGTH ELECTRODE IN SEMICONDUCTOR DEVICE

DESCRIPTION

TECHNICAL FIELD

This invention relates to semiconductor devices such as field-effect transistors (FET's) wherein one electrode, such as a gate electrode, is to be of short length. More particularly, the invention relates to a process of construction of such electrode to provide an asymmetric lightly doped drain (LDD) structure suitable for large scale integration without optical defraction limitations associated with lithographic masking, such construction being accomplished by use of a bird beak protuberance from the surface of a semiconductor wafer in conjunction with reactive ion etching which establish the dimensions of the electrode.

PRIOR ART

Semiconductor devices such as FET's can operate over a wide range of frequencies. Often, it is desirable to increase the upper frequency capability of the devices, this being accomplished by reducing the physical dimensions of key components of the device. In the case of an FET, the length of the gate is reduced to accommodate higher frequencies. With conventional photolithographic techniques of construction, among others, there are defraction limitations on the minimum size of gates which can be produced.

Many forms of circuits, such as those providing the functions of logic and memory, employ large numbers of FET's, and are constructed in the form of an integrated circuit (IC) chip, such large arrays of FET's being referred to as large scale or very large scale integration (VLSI) depending on the number of circuit elements on the chip. Photolithographic techniques including the use of masks are required in the manufacture of such chips. Since the gate in each of the many FET's on the chip is subject to the foregoing defraction limitation, there is an upper limit of the frequency response characteristics of FET circuit construction on such chips. The same limitation applies to the construction of other electrodes in such semiconductor devices.

A problem arises in that there are many situations in which a still higher frequency characteristic is desired. However, the high frequency characteristic can only be attained by avoidance of a manufacturing step involving the defraction limitation. Heretofore, no alternative manufacturing step has been employed for extremely narrow lines below say, 0.5 microns.

SUMMARY OF THE INVENTION

The foregoing problem is overcome and other advantages are provided, in accordance with the invention, by the construction of a semiconductor device. The abutment is employed in further steps of the fabrication of an electrode structure, which further steps are free of defraction limitations. The invention provides yet a further advantage, this advantage being the attainment of a more favorable control of the distribution of resistive impurities in the drain electrode of an FET referred to generally in the prior art as the lightly doped drain (LDD). This results in reduced electrical resistance and greater protection to avalanche breakdown than has been available previously. In particular, this ivnention provides a technique to built an asymmetric LDD structure in which only the drain electrode region is lightly doped.

While the invention is useful in the construction of a variety of semiconductor devices, it is most readily demonstrated in the construction of an FET from a suitably doped silicon wafer. The process begins by covering a portion of the wafer, up to the location where the gate is to be formed, with an oxygen impervious coating such as a coating of silicon nitride, $Si_3N_4$. Then the wafer is exposed to oxygen which diffuses into the exposed silicon as well as penetrating a relatively small distance under the edge of the nitride layer. The silicon and oxygen interact to form silicon dioxide, $SiO_2$, which has a larger volume than the reacting silicon. The resulting expansion lifts the exposed surface of the wafer and also bends the end of the nitride layer upward from the original wafer surface to form a shape known as a bird beak.

Heretofore, it has been the general principle to avoid the formation of a bird beak, thereby to preserve a smooth surface to the semiconductor structure. With the invention, the bird beak is created deliberately. The beak enables the formation of a supporting silicon dioxide abutment which maintains the gate structure in a position normal to the surface of a semiconductor wafer from which the IC is constructed.

In accordance with a feature of the invention, advantage is taken of the electrical insulating properties of the silicon dioxide beneath the nitride layer by forming the silicon dioxide into an insulating abutment. This is accomplished by a reactive ionic etch of the exposed silicon dioxide followed by a stripping of the nitride layer which leaves an abutment with a straight vertical wall at the site where the gate is to be formed. There follows a conformal deposition of a doped polysilicon layer upon the wafer and the abutment to a depth equal to the desired length of the gate. A vertically oriented reactive ion etch to the depth of the polysilicon layer removes all of the layer except for the gate alongside the vertical wall of the abutment. The source and the drain are then developed on opposite sides of the gate.

A further feature of the invention is found in the construction of the source and the drain by ion implanatation. The depths of the source and the drain regions depend on the stopping distance of the dopant atoms, the depth following the profile of the abutment in the active region of the drain. There results an improved impurity profile in the active region of the drain which offers protection from avalanche with reduced resistive power force to current flowing between the source and the drain, i.e., an asymmetric lightly doped drain structure.

BRIEF DESCRIPTION OF THE DRAWING

The foregoing aspects and other features of the invention are explained in the following description, taken in connection with the accompanying drawing wherein the sole figure shows an element which aids in construction of a semiconductor device, and the steps of a manufacturing process which are suitable for VLSI circuits and free of defraction limitation for construction of an electrode such as an FET gate.

DETAILED DESCRIPTION OF THE PREFERRED EMBODIMENT OF THE INVENTION

With reference to the drawing, there are depicted eight steps labeled A, B . . . H setting forth a process incorporating an insulating abutment of the invention for the formation of a gate electrode in a field-effect transistor. The gate has a length less than that provided by the defraction limitation of conventional lithographic technology to provide a higher frequency response than is generally attainable. In addition, the distribution of dopant impurities in the drain electrode of the FET is more precisely controlled than with conventional lithographic technology to permit a reduced total value of drain resistance while providing increased protection from avalance and the consequent burn-out of the FET. While this description is presented for construction of a gate electrode, it is to be understood that the same procedure and abutment can be employed for forming other components of a semiconductor device.

As shown in the drawing, a transistor 10 comprises a source 12, a drain 14 and a gate 16, and is substantially completed, as shown in step H, except for the attachment of leads. The leads are shown diagrammatically as a source lead 18, a drain lead 20 and a gate lead 22, and are attached in subsequent conventional manufacturing steps (not shown). The process of the invention includes the formation of an abutment 24 of insulating material such as silicon dioxide. The abutment 24 is upstanding from a substrate 26 of the transistor 10 at the location of the gate 16. The abutment 24 is maintained throughout the remainder of the process, and serves as a guide in the formation of gate 16.

The process of the invention begins with step A wherein a wafer 28 of semiconductor material is provided to serve as the substrate 26, the wafer 28 being coated with a layer 30 of silicon nitride. By way of example in the explanation of the invention, it is presumed that the wafer 28 is composed of p-type silicon, it being understood that other materials may be utilized. The layer 30 may be deposited by any suitable well known process such as chemical vapor deposition (CVD). The layer 30 is impervious to oxygen and protects the upper surface of the substrate 26 where covered by the layer 30. The layer 30 may have a thickness in the range of 500-1000 angstroms. An edge 32 of the layer 30 defines the location wherein the abutment 24 and the gate 16 are to be constructed.

In step B, the wafer is exposed to oxygen at a temperature in range of 900°-1100° C. Oxygen diffuses into the silicon of the wafer 28 to build up a layer 34 of silicon dioxide on the exposed surface of the wafer 28. The area of the wafer 28 which is protected by the layer 30 does not receive the oxygenation except for a region near the edge 32 wherein there is a penetration of the oxygen to build up oxide which lifts the edge 32 of the layer 30 to form a structure known as a bird beak 36. It is noted that a portion of the oxide develops at a location above the original surface 38 while the balance of the oxide develops at a location beneath the original surface 38. The two portions of the oxide are approximately evenly split, there being approximately 45 precent silicon dioxide above the surface 38 and 55 percent silicon dioxide beneath the surface 38. The depth of the layer 34 is in the range typically of 3000-5000 angstroms. The length of the bird beak 36 is also approximately 3000-5000 angstroms.

At step C, the layer 34 is removed by reactive ion etching done in a vertical direction. The portion of the oxide beneath the bird beak 36 is shielded from the etchant by the silicon-nitride layer 30. Thus, only the exposed portion of the silicon dioxide is etched to provide a vertical wall 40 of the abutment 24. The etching of the oxide is accomplished with a well known reactive ion etch (RIE) which is selective to the silicon dioxide and does not harm either the silicon of the wafer 28 or the silicon-nitride of the layer 30.

At step D the silicon nitride layer 30 is removed with a standard well-known wet chemical etchant to retrieve the structure composed of the wafer 28 as modified by the development of the abutment 24. The abutment 24 rises from a location beneath the original surface 38 to a location above the original surface 38 of the wafer 28. Removal of the layer 30 leaves a slanting roof 42 to the abutment 24, the roof 42 joining the upper edge of the wall 40.

In step E, the semiconductor structure of step D is again subjected to an oxygen atmosphere at an elevated temperature of 900°-1100° C. for the development of a further oxide layer 44. The silicon dioxide of the layer 44 develops on both sides of the abutment 24 upon the diffusion of the oxygen into the silicon. During the growing of the layer 44, there is relatively little development of additional oxide at the site of the abutment 24 because the silicon dioxide therein acts as a barrier to further diffusion between the oxygen and the silicon.

The process continues with step F wherein the semiconductor is exposed to silicon which is deposited by chemical vapor deposition (CVD), this deposition being accomplished conformally with the result that a polycrystalline layer 46 with n-type doping develops uniformally upon the layer 44 as well as on the wall 40 of the abutment 24. The polycrystalline form of the silicon in the layer 46 as referred to as polysilicon and is grown to a thickness equal to the desired length of the gate 16, typically in the range of 2000-5000 angstroms. The polysilicon is deposited by use of silane $SiH_4$ which, at a temperature in the range of 600°-700° C. produces the desired layer of polysilicon heavily doped with a suitable impurity to enhance its conductivity.

In step G, the polysilicon of the layer 46 is etched away by reactive ion etching through a depth equal to the depth of the layer 46. During the etching, the appropriate plasma ions are directed by an electric field perpendicular to the original surface of the wafer 28 and, therefore, such etching does not eat into the surface of the layer 44 parallel to the wall 40. As a result of the etching, all of the polysilicon is removed except for the region contiguous to the wall 40 and to the layer 44, this remaining region of polysilicon serving as the gate 16.

Finally, in step H, source and drain are developed by ion implantation of an n-type dopant such as arsenic or phosphorus. The implantation is directed at the upper surface of the semiconductor device. The depth of implantation is dependent on the stopping distance of the dopant atoms at the implanting energy and the material at the upper surface of the semiconductor device. Therefore, there develops a layer, the bottom of which is indicated by a line 48, that has a profile which follows the profile of the top surface of the semiconductor device, including the region of the abutment 24 and the gate 16. This results in the appearance of a bump at the site of the abutment 24 and the gate 16. The region of the ionically doped layer to the left of and beneath the abutment 24 forms a region of the drain 14, while the portion of the ionically implanted layer to the right of the gate 16 forms a region of the source 12. Upon the application of suitable positive voltages to the gate 16 and to the drain 14 relative to the source 12, a charge conduction channel 50 develops between the region of the drain 14 and the region of the source 12. The channel 50 passes beneath the electrically-insulating silicon-dioxide layer 44 and the bottom of the silicon dioxide of the abutment 24. While the line 48 passes above the channel 50, it is noted that the implantation of the dopant occurs to a depth governed by the laws of projectile kinetics and statistics and, accordingly, there is some dopant present at the region of the channel 50.

A feature of the invention is found in the reduced amount of dopant in the region of the channel 50. By selection of a suitable voltage in the ion implantation, and by selection of a suitable height for the abutment 24, the amount of dopant in the drain side of the channel 50 can be carefully controlled so as to provide adequate protection from avalanche breakdown while avoiding excessive amounts of electrical resistance in the drain 14. Such resistance is dependant on the amount of doping, and increases with increased doping. Thereby, the semiconductor device, as shown at step H, can be used effectively as a field effect-transistor with minimal power loss due to the presence of resistance in the path of the channel 50 between the regions of the drain 14 and the gate 16. As noted above, this is accomplished with adequate protection from avalanche and the subsequent damage which might result from excessive heating of the transistor.

The foregoing teachings of the invention are believed to be applicable also to materials other than silicon, and for the development of electrode structures other than that of the gate of and FET. The foregoing process also applies to a substrate of type n-silicon in which case the source and drain regions would be doped with a p-type dopant such as boron. The depth of the region of the drain 14, as well as the depth of the region of the source 12 (between the layer 44 and the line 48) is in the range of approximately 1000-2000 angstroms. During the ion implantation of the source and drain regions, a dose of $10^{14}$–$10^{15}$ atoms per square centimeter is generally used.

It is noted that the foregoing process employs a standard form of polysilicon gate structure, and is compatible with present VLSI technology. The length of the gate 16 has been determined without lithography, that is, the length of the gate is determined by the thickness of the chemical vapor deposition of the polysilicon. The depth of the polysilicon is readily selected and is not subjected to optical defraction limitations associated with lithography. Since the gate length is equal to the depth of the polysilicon layer, the extremely short gate length is established without limitations as to defraction effect. It is noted that all portions of the gate structure and the intervening regions with the source and the drain can be precisely controlled as to their geometry. In addition, a light level of doping can be accurately established for the drain side of the channel 50 to provide the above-noted advantages of reduced power loss and protection from avalanche breakdown. The polysilicon typically is heavily doped with an impurity such as arsenic to provide good conduction in the gate 16. The slanting roof 42 of the abutment 24 provides for the gradual elongation of the lightly doped drain portion of the channel 50 so as to spread out the electric field distribution and avoid any strong radiance which might otherwise result in highly localized concentration of electric field which in turn causes breakdown.

It is to be understood that the above described embodiment of the invention is illustrative only, and that modifications thereof may occur to those skilled in the art. Accordingly, this invention is not be regarded as limited to the embodiment disclosure and, but is to be limited as defined by the appended claims.

Having thus described our invention, what we claims as new, and desire to secure by Letters Patent is:

1. In a semiconductor device, a process of constructing a gate electrode adjacent a charge conduction channel comprising:
   providing a substrate of semiconductor material;
   covering a portion of a surface of said substrate with an oxidation resistant layer, said layer terminating at the site where the gate electrode is to be found;
   oxidizing the exposed surface of said substrate to form an oxide of said material causing the edge of said layer to rise as a bird beak, the oxide developing both above and below said exposed surfaces and extending under said oxidation resistant layer, the thickness of the oxide diminishing with increasing distance under said layer with a wedge-shaped profile having upper and lower sloping surfaces;
   etching away exposed portions of said oxide leaving an abutment of said oxide within a vertical wall at said site;
   stripping said layer from said substrate and said abutment;
   reoxidizing said substrate to form an oxide layer;
   depositing conformally an electrically conductive layer on said oxide layer to a depth equal to a desired length of said gate electrode;
   etching said conduction layer directionally in a vertical direction up to a depth equal to said gate-electrode length; and
   doping a surface region of said substrate and said abutment to a predetermined depth profile which follows a profile of said bird beak to provide a charge conduction band which is partially constricted at one side of the said abutment, constriction of the charge conduction band being formed in an asymmetrical semiconductor structure formed by said lower sloping oxide surface.

2. A process according to claim 1 wherein said first step of etching is accomplished by reactive ion etching in a vertical direction.

3. A process according to claim 2 wherein said second etching is accomplished by reactive ion etching.

4. A process according to claim 1 wherein said step of doping is accomplished by ion implantation to form a source and a drain, the oxide of said abutment being an electrical insulator which constricts said conduction channel.

5. A process according to claim 4 wherein, in said step of providing, said substrate is formed of silicon.

6. A process according to claim 5 wherein, in said step of covering, said oxidation resistant layer is formed of silicon nitride.

7. A process according to claim 6 wherein, in said step of depositing, said electrically conductive layer is formed of doped polysilicon.

8. A process according to claim 7 further comprising a doping of said silicon substrate, said second step of doping providing either type-p or type-n doping and said first step of doping providing, respectively, either type-n or type-p doping.

9. In a semiconductor device, a process of constructing a gate electrode adjacent a charge conduction channel comprising:
   forming a bird beak on a surface of semiconductor material, said bird beak including an abutment formed as an oxide of said material, said step of forming including a developing of the oxide both above and below said surface and extending in a direction along the charge conduction channel, the thickness of the oxide diminishing along said direction with a wedge-shaped profile having upper and lower sloping surfaces;

shaping said abutment to provide a substantially vertical wall and a slanting roof connecting with a top edge of said wall;

depositing conformally an electrically conducting layer against said wall and in contact with said surface, the depth of said layer being equal to a desired length of said gate electrode; and implanting a dopant in a surface region of said material with a depth profile following the shape of a profile of said abutment to provide a charge conduction channel passing beneath said gate electrode, a portion of said channel being constricted by said oxide at said abutment to establish electrical resistance of said channel, constriction of the charge conduction band being formed in an asymmetrical semiconductor structure formed by said lower sloping oxide surface.

10. A process according to claim 9 wherein said implanting a dopant is accomplished by ion implantation to form a source and a drain, the oxide of said abutment being an electrical insulator which pinches off said conduction channel.

11. A process according to claim 10 wherein, in said step of forming, said semiconductor material is silicon and wherein, in said step of depositing, said electrically conducting layer is composed of a doped polysilicon.

* * * * *